(12) United States Patent
Amir

(10) Patent No.: US 9,753,364 B2
(45) Date of Patent: Sep. 5, 2017

(54) PRODUCING RESIST LAYERS USING FINE SEGMENTATION

(71) Applicant: KLA-TENCOR CORPORATION, Milpitas, CA (US)

(72) Inventor: Nuriel Amir, St. Yokne'am (IL)

(73) Assignee: KLA-Tencor Corporation, Milpitas, CA (US)

( * ) Notice: Subject to any disclaimer, the term of this patent is extended or adjusted under 35 U.S.C. 154(b) by 142 days.

(21) Appl. No.: 14/734,460

(22) Filed: Jun. 9, 2015

(65) Prior Publication Data

US 2015/0268551 A1    Sep. 24, 2015

Related U.S. Application Data

(63) Continuation of application No. PCT/US2014/046523, filed on Jul. 14, 2014.

(60) Provisional application No. 61/846,609, filed on Jul. 15, 2013.

(51) Int. Cl.
*G06F 17/50* (2006.01)
*G03F 1/38* (2012.01)
*G03F 7/20* (2006.01)

(52) U.S. Cl.
CPC ............ *G03F 1/38* (2013.01); *G03F 7/20* (2013.01); *G03F 7/70633* (2013.01); *G03F 7/70683* (2013.01); *G06F 17/5068* (2013.01); *Y10T 428/24802* (2015.01)

(58) Field of Classification Search
CPC .......... G03F 1/38; G03F 7/20; G03F 7/70633; G03F 7/70683; G06F 17/5068; Y10T 428/24802
See application file for complete search history.

(56) References Cited

U.S. PATENT DOCUMENTS

| | | |
|---|---|---|
| 2003/0156276 A1 | 8/2003 | Bowes |
| 2003/0160163 A1* | 8/2003 | Wong ..................... G02B 27/46 250/237 R |
| 2004/0190008 A1 | 9/2004 | Mieher et al. |
| 2005/0105092 A1* | 5/2005 | Ausschnitt .......... G03F 7/70633 356/401 |
| 2005/0173634 A1* | 8/2005 | Wong ..................... G02B 27/46 250/311 |
| 2007/0081170 A1 | 4/2007 | Sezginer et al. |

(Continued)

FOREIGN PATENT DOCUMENTS

KR    20100074056 A    7/2010

*Primary Examiner* — Vuthe Siek

(74) *Attorney, Agent, or Firm* — Suiter Swantz pc llo

(57) ABSTRACT

Methods of designing resist layers to enhance production accuracy, as well as respective layers, design files and metrology targets are disclosed. Continuous or uniform feature(s) adjacent to segmented feature(s) having a pitch and a critical dimension (CD), are configured by design to be segmented upon exposure at a same pitch and a smaller CD than the segmented feature(s), to yield respective unsegmented continuous feature(s) upon development of the exposed resist. The disclosed approach allows producing imaging and scatterometry targets which are compatible with device design rules and with optical constraints of the exposure system, without loss of contrast of the produced targets. The methods may be fine-tuned according to the specific characteristics of lithography tools which are used in the production.

36 Claims, 6 Drawing Sheets

(56) References Cited

U.S. PATENT DOCUMENTS

2010/0005442 A1 1/2010 Ghinovker et al.
2011/0028004 A1 2/2011 Wang et al.
2013/0107259 A1* 5/2013 Choi .................. G03F 7/70683
　　　　　　　　　　　　　　　　　　　　　　　356/401

* cited by examiner

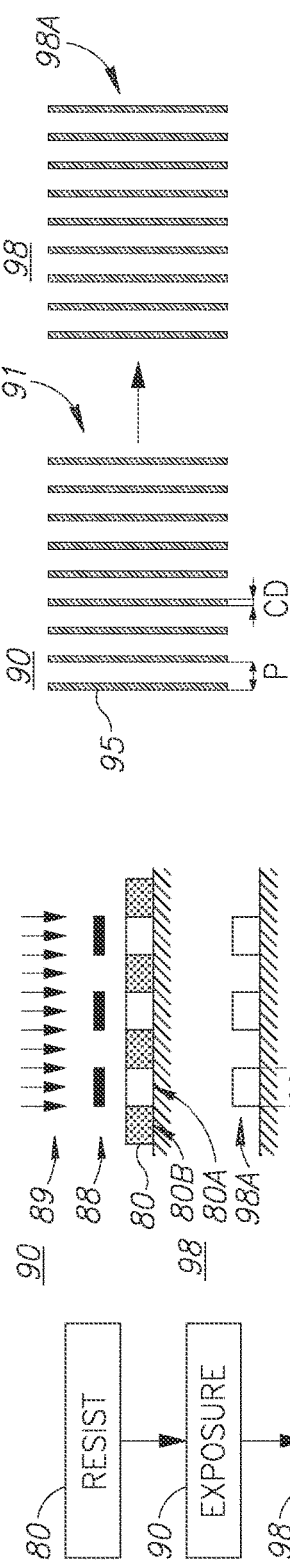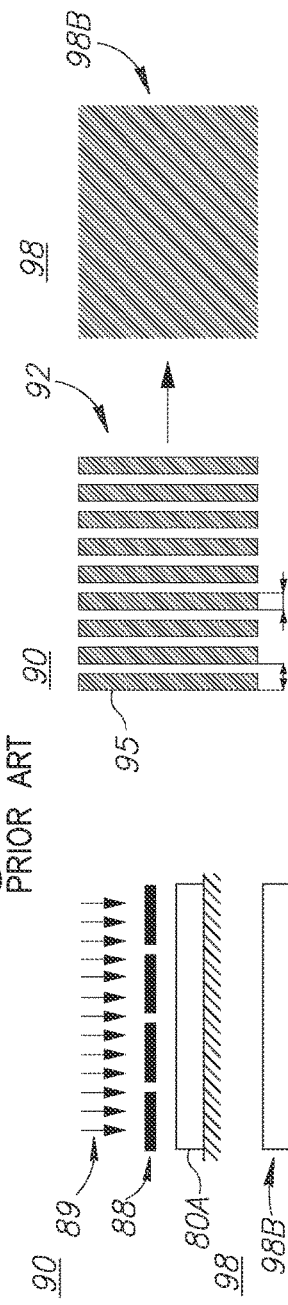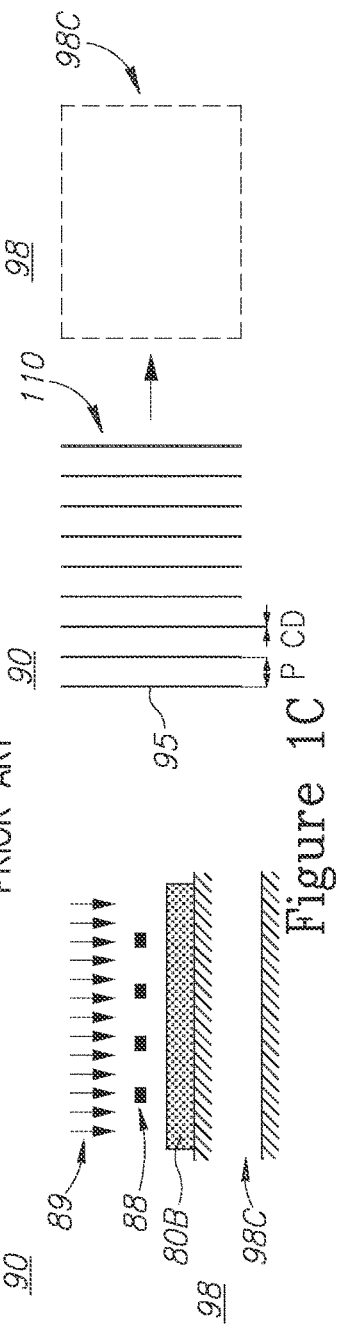
Figure 1A PRIOR ART
Figure 1B PRIOR ART
Figure 1C

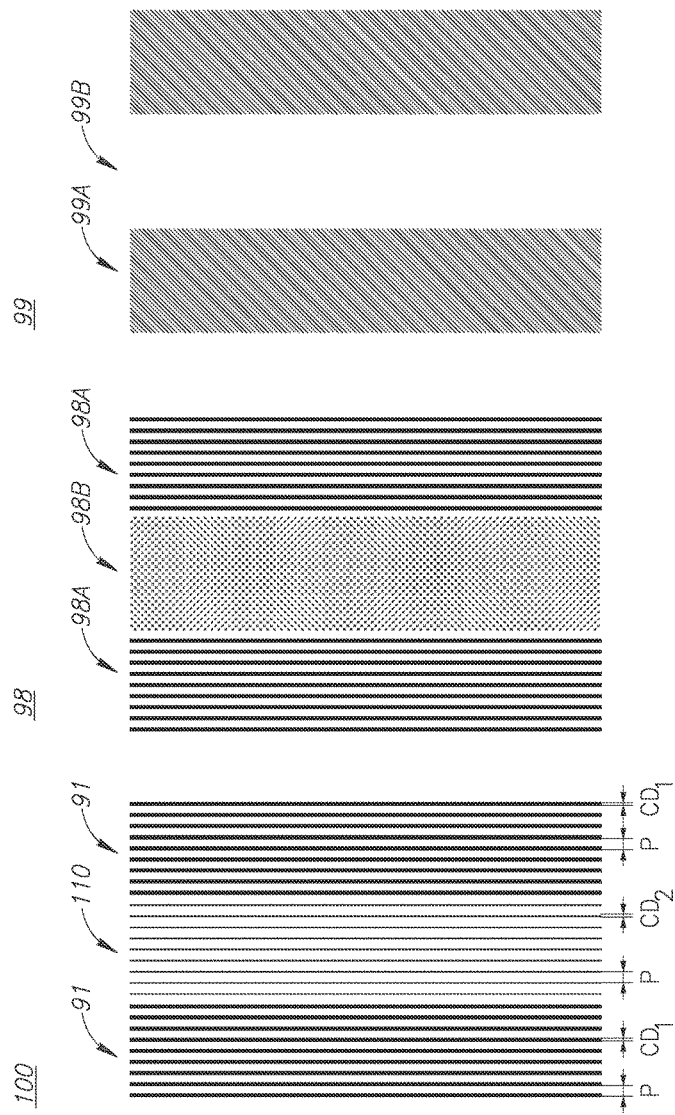

200

210 — DESIGNING CONTINUOUS FEATURE(S), ADJACENT TO SEGMENTED FEATURE(S), TO BE SEGMENTED UPON EXPOSURE AT A SAME PITCH AND A SMALLER CD TO YIELD REMOVAL OF SEGMENTATION UPON DEVELOPMENT

215 — EXPOSING THE DESIGNED PATTERN

217 — DEVELOPING THE EXPOSED RESIST TO YIELD THE UNSEGMENTED CONTINUOUS FEATURE

220 — SELECTING THE SMALLER CD TO BE SMALLER THAN HALF THE CD OF THE SEGMENTED FEATURE

225 — DETERMINING THE SMALLER CD EXPERIMENTALLY ACCORDING TO PRODUCTION TOOL PERFORMANCE

230 — CONFIGURING THE METROLOGY TARGET AS AN IMAGING TARGET

235 — CONFIGURING THE METROLOGY TARGET AS A SCATTEROMETRY TARGET

240 — DESIGNING THE CONTINUOUS FEATURE(S) AND THE ADJACENT SEGMENTED FEATURE(S) TO BE SEGMENTED ALONG SHORT SIDES THEREOF

Figure 5

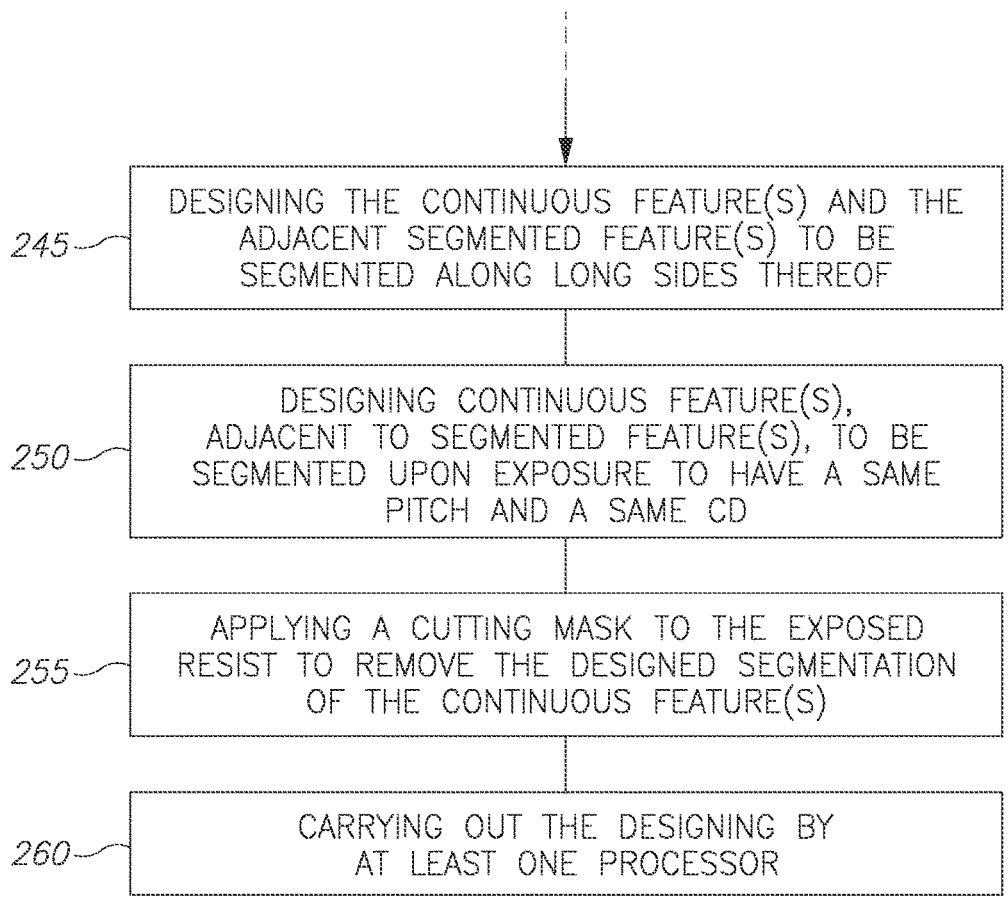
Figure 5 (cont. 1)

PRODUCING RESIST LAYERS USING FINE SEGMENTATION

CROSS REFERENCE TO RELATED APPLICATIONS

This application is filed under 35 U.S.C. §120 and §365(c) as a continuation of International Patent Application Serial No. PCT/US14/46523, filed on Jul. 14, 2014, which application claims the benefit under 35 U.S.C. 119(e) of U.S. Provisional Patent Application No. 61/846,609, filed on Jul. 15, 2013, which applications are incorporated herein by reference in their entirety.

FIELD OF THE INVENTION

The present invention relates to the field of metrology, and more particularly, to metrology target production.

BACKGROUND OF THE INVENTION

U.S. Patent Publication No. US2011/0028004, which is incorporated herein by reference in its entirety, discloses a mark used in the determination of overlay error and comprises sub-features, the sub-features having a smallest pitch approximately equal to the smallest pitch of the product features. The sensitivity to distortions and aberrations is similar as that for the product features. When the mark is developed the sub-features merge and the outline of the larger feature is developed.

BRIEF SUMMARY OF THE INVENTION

One aspect of the present invention provides a method comprising designing, in at least one layer of a metrology target, at least one continuous feature, which is adjacent to at least one segmented feature having a pitch and a critical dimension (CD), to be segmented upon exposure at a same pitch and a smaller CD with respect to the adjacent at least one segmented feature, to yield at least one respective unsegmented continuous feature upon development of the exposed design.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIG. 1A schematically illustrates exposure states and development states of resist layers in commonplace designs;

FIG. 1B schematically illustrates exposure states and development states of resist layers in other prior art designs;

FIG. 1C schematically illustrates exposure states and development states of resist layers in featured designs according to some embodiments of the invention;

FIG. 2 is a high level schematic illustration of a region on a resist layer used to produce a metrology target, according to some embodiments of the invention;

DETAILED DESCRIPTION OF THE INVENTION

Figure 3:
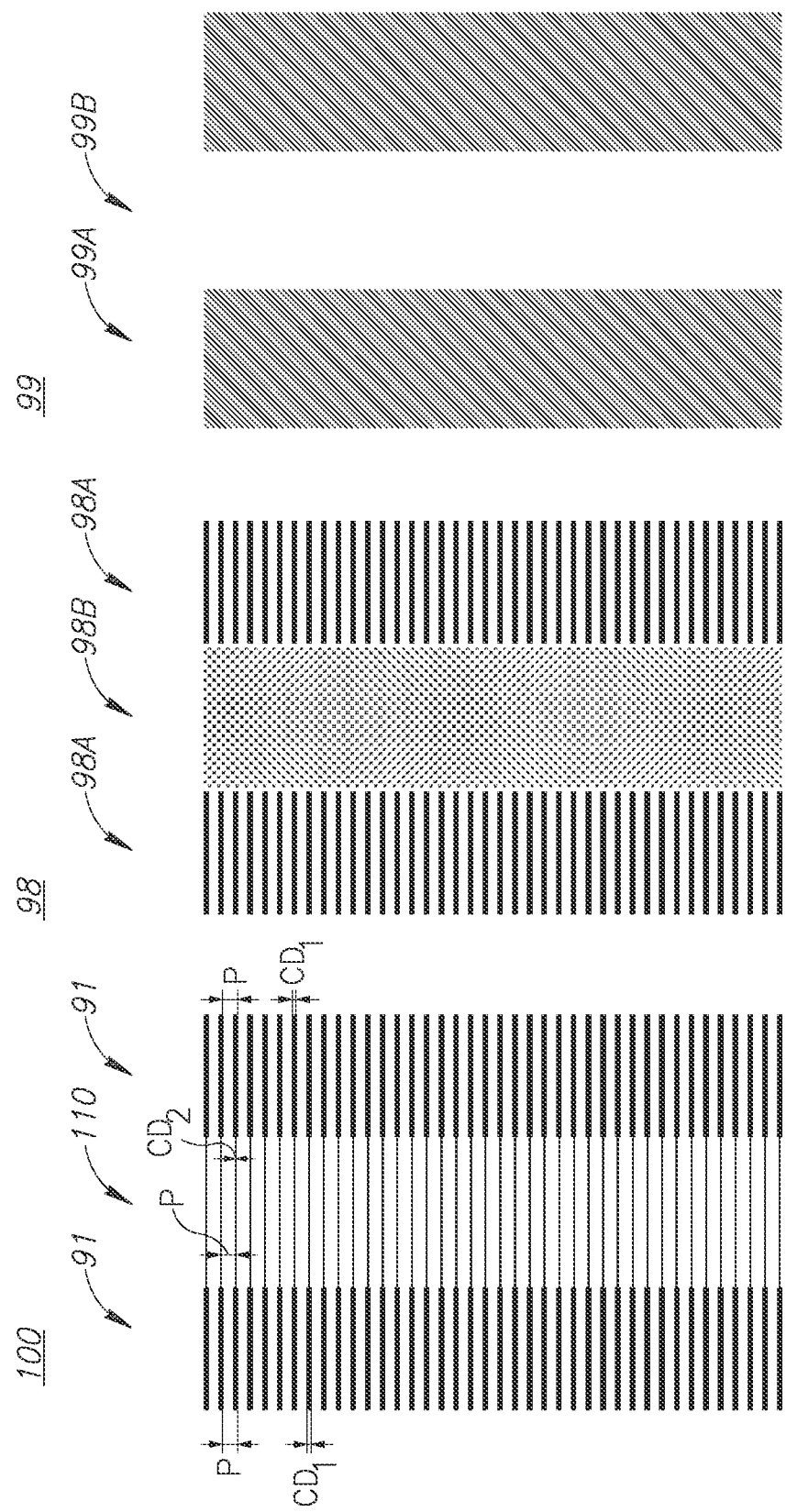
FIG. 3 is a high level schematic illustration of a region on a resist layer used to produce a metrology target, according to some embodiments of the invention.

Prior to the detailed description being set forth, it may be helpful to set forth definitions of certain terms that will be used hereinafter.

The terms "metrology target" or "target" as used herein in this application, are defined as any structure designed or produced on a wafer which is used for metrological purposes. Non-limiting examples for metrology targets are imaging targets such as Box-in-Box (BiB) targets, AIM targets (advance imaging metrology), AIMid targets, Blossom targets, variants thereof and alternatives therefor, and scatterometry targets such as periodic structures (e.g., gratings), like SCOL (scatterometry overlay) targets and alternatives therefor, DBO (diffraction based overlay) targets, and variants thereof, etc.

The terms "target feature" as used herein in this application refers to parts of targets such as segmented or unsegmented regions, generally having uniform or periodic nature. Periodic features are also referred to as segmented features. The term "continuous feature" refers to an unsegmented feature which is continuous in the spatial sense, covering a region of the target uniformly. The terms "continuous feature," "empty region," and "full bar" are used herein in this application interchangeably, and are defined as continuous target features having dimensions which are large with respect to typical device features. While most of the description refers to empty regions as the continuous features in target designs, it is explicitly noted that similar design principles are applicable to full bars as continuous features, and respective targets are likewise part of the disclosed invention.

With respect to resist layers, the terms "exposure" and "development" as used herein in this application refer to production steps of the resist layer involving exposure of the resist layer to radiation through a mask ("exposure") and removing exposed or unexposed resist material, depending on the type of the resist, i.e. whether it is positive resist or negative resist, respectively ("development"). The term "measurement" as used herein in this application refers to any future imaging or scatterometry measurement of the targets produced using the disclosed resist layers.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments, and is capable of being practiced or carried out in various ways. Also, it is to be understood that the phraseology and terminology employed herein is for the purpose of description and should not be regarded as limiting.

Methods of designing resist layers to enhance production accuracy, as well as respective layers, design files, and metrology targets are disclosed. Continuous or uniform feature(s) adjacent to segmented feature(s) having a pitch and a critical dimension (CD), are configured by design to be segmented upon exposure at a same pitch and a smaller CD than the segmented feature(s), to yield respective unsegmented continuous feature(s) upon development of the exposed resist. The disclosed approach allows producing imaging and scatterometry targets which are compatible with device design rules and with optical constraints of the exposure system, without loss of contrast of the produced targets. The methods may be fine-tuned according to the specific characteristics of lithography tools which are used in the production.

FIGS. 1A-1C schematically illustrate exposure states 90 and development states 98 of different resist features. Presented to the left of FIG. 1A, is a schematic overview of the lithographic processes which are relevant to the current invention. The disclosed invention relates to production of resist layers 80 in the lithography process. Specifically, resist layers are deposited on the wafer, e.g., in a spin process (denoted resist step 80), and are then exposed to radiation 89 through a mask 88 to form respective patterns (denoted exposure step 90, or patterning). The radiation 89 modifies exposed resist material 80A, 80B and, depending on the type of the resist, determines the differential removal of resist material 80A, 80B during a subsequent development step 98. In the illustrated non-limiting example, resist layer 80 is depicted as positive, i.e., exposed resist material 80B is removed by development 98 while masked resist material 80A is retained. When the produced structure is a metrology target, a measurement step 99 ensues, in which imaging and/or scatterometry measurements are carried out. In each of FIGS. 1A-1C, a left hand illustration shows schematically a cross section of exposure step 90 and development stage 98, while right hand illustrations show schematically top views of the resist layer 80 after application of exposure step 90 and development stage 98.

FIG. 1A, representing prior art, illustrates segments 95 in a designed feature 91 having a pitch p and a critical dimension CD which are exposed 90 and developed 98 to exhibit essentially the same pitch p and typical critical dimension CD, i.e., developed feature 98A is segmented as designed.

FIG. 1B illustrates segments 95 in a designed feature 92 having a pitch p and a critical dimension CD, the latter being significantly larger than in designed feature 91. Upon development 98, segments 95 of exposed feature 90 merge to yield a continuous feature 98B. The merging of segments 95 results from the high CD/pitch ratio which cannot be correctly developed. As illustrated in the cross section illustration, the wide (large CD) mask elements 88 prevent significant exposure of resist material between the wide segments, which thus remains undeveloped. This design is taught in the prior art, e.g., in U.S. Patent Publication No. 2011/0028004, which teaches using such patterning to produce scatterometry targets.

In contrast to the cases illustrated in FIGS. 1A and 1B. FIG. 1C discloses a mask design 88 that creates exposed resist features 110 having segments at a same pitch p but with a significantly smaller CD than in design 91. Development 98C of exposed feature 110 results in a continuous feature, without the segmentation. As illustrated in the cross section illustration, the thin (small CD) mask elements 88 do not effectively mask the underlying resist regions 80B, which are subsequently developed and removed to yield continuous feature 98C. Advantageously, such design retains the spatial frequency of the segments over the continuous feature 98C as the segment pitch does not change, and is thus exposed over the same lens region that affects the same illumination angle, correlating with the same pupil plane position and spatial frequency. Such design thus maintains uniform optical performance during exposure of the resist 80B and consequently, optical aberrations are avoided, especially along edges of the adjacent segmented features (see below), while development 98 still yields developed features 89C having dimensions which comply with imaging and scatterometry requirements.

FIG. 2 is a high level schematic illustration of a region on a resist layer 80 in a produced metrology target, according to some embodiments of the invention. The resist layer, at development 98, may comprise at least one layer having at least one continuous feature 98B (the hatched region in the central illustration represents a continuous feature 98B which may be full or empty, i.e. a gap, depending on the type of resist 80) adjacent to at least one segmented feature 98A having a pitch and a critical dimension $CD_1$. At least one continuous feature 98B may be configured by design 100 to be segmented upon exposure at a same pitch p and a smaller $CD_2 < CD_1$ with respect to adjacent at least one segmented feature 91, to yield at least one respective unsegmented continuous feature 98B upon development 98 of exposed design 100. Upon imaging measurement 99 of the respective target region, both segmented features 99A and continuous feature(s) 99B appear continuous and provide sufficient imaging contrast. In FIG. 2, at least one continuous feature 110 and adjacent at least one segmented feature 91 are segmented along short sides thereof.

FIG. 3 is a high level schematic illustration of a region on a resist layer 80 in a produced metrology target, according to some embodiments of the invention. The resist layer 80, at development 98, may comprise at least one layer having at least one continuous feature 98B (the hatched region in the central illustration represents a continuous feature 98B which may be full or empty, i.e. a gap, depending on the type of resist 80) adjacent to at least one segmented feature 98A having a pitch and a critical dimension $CD_1$. At least one continuous feature 98B may be configured by design 100 to be segmented upon exposure at a same pitch p and a smaller $CD_2 < CD_1$ with respect to adjacent at least one segmented feature 91, to yield at least one respective unsegmented continuous feature 98B upon development 98 of exposed design 100. Upon scatterometry measurement 99 of the respective target region, both segmented features 99A and continuous feature(s) 99B diffract the illumination as continuous features and provide sufficiently accurate scatterometry results. In FIG. 3, at least one continuous feature 110 and adjacent at least one segmented feature 91 are segmented along long sides thereof.

Resist layers 80 illustrated in FIGS. 2, 3 as well as resist layers designed according to the disclosed principles may be used for imaging and/or scatterometry targets. In certain non-limiting embodiments, metrology targets produced using resist layers 80 having features illustrated in FIG. 2 may be designed as imaging targets, while metrology targets produced using resist layers 80 having features illustrated in FIG. 3 are designed as scatterometry targets. The disclosed targets maintain contrast between features 99A, 99B yet comply with device design rules and provide accurate patterning during exposure stage 90 and hence exhibit accurate production of feature edges.

Certain embodiments provide feature designs which take advantage of production limitations such as scanner's ability to print and to use both device-scale segmentation of the features and target-scale contrast between the features. Any number of target layers may be design and produced using resist layers 80 according to the disclosed principles.

In certain embodiments, CD of segments 95 in continuous feature 110, $CD_2$, is about half the CD of adjacent segmented features, $CD_1$, or smaller. For example, $CD_2$ may be between 10-20 nm for P~80 nm depending on the exposure and development parameters, possibly of specific tools, determined experimentally on a case by case basis. In certain embodiments, CD of segments 95 in continuous feature 110, $CD_2$, is determined experimentally according to production tool performance.

Figure 4:
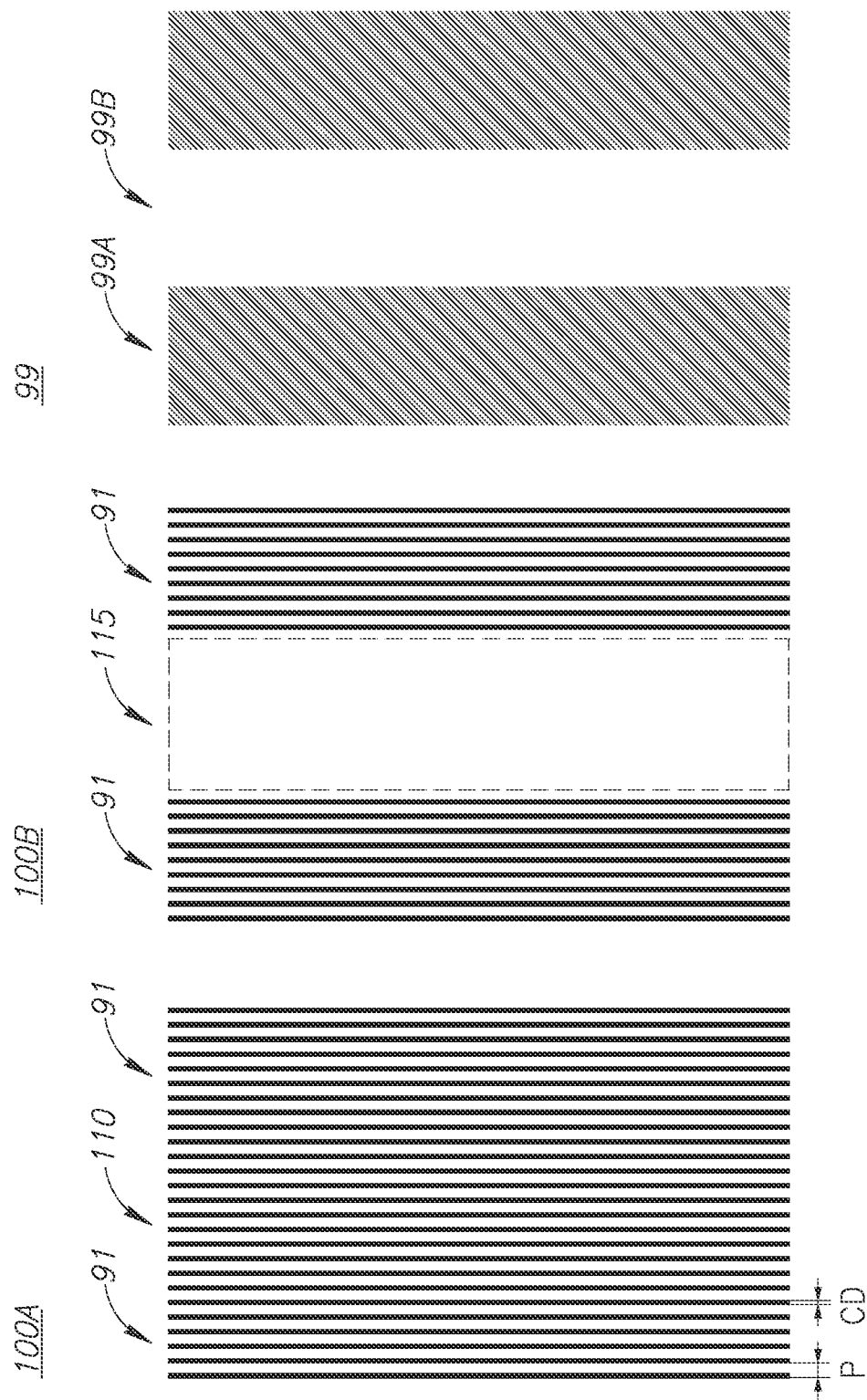
FIG. 4 is a high level schematic illustration of a region on a resist layer used to produce a metrology target, according to some embodiments of the invention; and, FIG. 5 is a high level flowchart illustrating a method, according to some embodiments of the invention.

FIG. 4 is a high level schematic illustration of a region on a resist layer 80 used to produce a metrology target, according to some embodiments of the invention. The resist layer 80 at development 98 may comprise at least one layer having at least one continuous feature adjacent to at least one segmented feature 91 having a pitch and a critical dimension CD. The at least one continuous feature may be configured by design 110 to be segmented upon initial exposure 100A at a same pitch p and a same CD with respect to adjacent at least one segmented feature 91, and remove the segmentation consecutively by applying a cutting mask 115 at a subsequent exposure 100B. Upon imaging or scatterometry 99, both segmented features 99A and continuous feature(s) 99B appear continuous and provide sufficient imaging contrast and/or accurate diffraction images. Subsequent exposure 100B, which may be part of any following lithography process, may apply second patterning to remove segments 95 from the continuous feature. In this way, no edge effects on features 91, 110 take place, as these are produced with identical segmentation until applying cutting mask 115.

It is noted that, in contrast to U.S. Patent Publication No. 2011/0028004, certain embodiments of the current invention use over-development of the resist layer 80 in the sense of FIG. 1C to yield empty, completely developed continuous features, while U.S. Patent Publication No. 2011/0028004 teaches under-development of the resist layer 80 in the sense of FIG. 1B to yield full, undeveloped, continuous features. Moreover, certain embodiments of the current disclosure comprise full continuous features (e.g., using negative resists) for imaging purposes, white U.S. Patent Publication No. 2011/0028004 only teaches scatterometry targets. In certain embodiments, the current disclosure comprises using segments having $CD_2 > CD_1$ as in U.S. Patent Publication No. 2011/0028004, but for resist layers involved in the production of imaging targets.

Certain embodiments of the invention comprise an exposed resist layer, in which at least one continuous feature, which is adjacent to at least one segmented feature having a pitch and a critical dimension (CD), is designed to have a same pitch and a smaller CD with respect to the adjacent at least one segmented feature. For example, the smaller CD may be smaller than half the CD of the at least one segmented feature and/or be determined experimentally according to production tool performance with respect to exposure and development parameters. The exposed resist layers may be configured to produce respective layers of an imaging target and/or of a scatterometry target. The design of the at least one continuous feature and the adjacent at least one segmented feature may be segmented along short or long sides thereof. The at least one continuous feature may be a respective at least one gap. Metrology targets produced using the exposed resist layers and masks 88 designed to yield the exposed resist layers are likewise parts of the current disclosure.

Certain embodiments of the invention comprise a mask designed to have, in place of at least one continuous feature, which is adjacent to at least one segmented feature having a pitch and a critical dimension (CD), at least one respective segmented feature which is segmented with a same pitch and a smaller CD with respect to the adjacent at least one segmented feature. As disclosed above, in the masks too the smaller CD may be smaller than half the CD of the at least one segmented feature and/or determined experimentally according to production tool performance with respect to exposure and development parameters. The masks may be configured to produce respective layers of an imaging target and/or of a scatterometry target. The design of the at least one continuous feature and the adjacent at least one segmented feature may be segmented along short or long sides thereof. The at least one continuous feature may be a respective at least one gap. Exposed resist layers and metrology targets produced using the masks, as well as production equipment, configured to produce any of the metrology targets are likewise parts of the current disclosure.

FIG. 5 is a high level flowchart illustrating a method 200, according to some embodiments of the invention. Design stages of method 200 may be carried out by at least one processor (stage 260), and respective computer program products comprising a computer readable storage medium having computer readable program embodied therewith and configured to carry out the designing, as well as resulting design files, are likewise provided herein. Method 200 may comprise either or both design stages and production stages.

Method 200 may comprise designing, in at least one layer of a metrology target, at least one continuous feature, which is adjacent to at least one segmented feature having a pitch and a critical dimension (CD), to be segmented upon exposure at a same pitch and a smaller CD with respect to the adjacent at least one segmented feature, to yield at least one respective unsegmented continuous feature upon development of the exposed design (stage 210), i.e., to yield removal of segmentation upon development.

Method 200 may comprise designing, in at least one resist layer used in the production of a metrology target, a pattern having at least one continuous feature, which is adjacent to at least one segmented feature having a pitch and a critical dimension (CD), to have a same pitch and a smaller CD with respect to the adjacent at least one segmented feature (stage 210), exposing the designed pattern to yield the resist layer (stage 215), and developing the exposed resist to yield at least one respective unsegmented continuous feature (stage 217).

In certain embodiments, method 200 may further comprise selecting the smaller CD to be smaller than half the CD of the at least one segmented feature (stage 220).

In certain embodiments, method 200 may further comprise determining the smaller CD experimentally according to production tool performance (stage 225).

Method 200 may comprise configuring the metrology target as an imaging target (stage 230) and/or configuring the metrology target as a scatterometry target (stage 235).

Method 200 may comprise designing the at least one continuous feature and the adjacent at least one segmented feature to be segmented along short sides thereof (stage 240)

and/or designing the at least one continuous feature and the adjacent at least one segmented feature to be segmented along long sides thereof (stage 245). Different features in the target may be designed according to disclosed method 200 in different directions.

In certain embodiments, method 200 may comprise designing, in at least one layer used in the production of a metrology target, a pattern having at least one continuous feature, which is adjacent to at least one segmented feature having a pitch and a critical dimension (CD), to have a same pitch and a same CD with respect to the adjacent at least one segmented feature (stage 250), exposing the designed pattern to yield the resist layer (stage 215), and applying a cutting mask to the exposed resist layer to remove the designed segmentation of the at least one continuous feature (stage 255).

In certain embodiments, the at least one continuous feature may be a respective at least one gap. Target design files, exposed resist layers and metrology targets produced using stages of method 200, as well as production equipment, configured carry out method 200 are likewise parts of the current disclosure.

Advantageously, the disclosed targets and methods exhibit at least the following aspects which are not taught by U.S. Patent Publication No. US2011/0028004: (i) Imaging targets having high contrast as well as design rules compatible and optically accurate features, (ii) segmentation at sub-device CDs, namely at CDs below typical device CDs, (iii) utilization of printing limitations of the scanner, or generally utilization of the boundaries of the production tool performance envelope to avoid development of the sub-device segmentation, and (iv) removal of segmentation by a cutting mask.

In the above description, an embodiment is an example or implementation of the invention. The various appearances of "one embodiment," "an embodiment," "certain embodiments," or "some embodiments" do not necessarily all refer to the same embodiments.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Certain embodiments of the invention may include features from different embodiments disclosed above, and certain embodiments may incorporate elements from other embodiments disclosed above. The disclosure of elements of the invention in the context of a specific embodiment is not to be taken as limiting their used in the specific embodiment alone.

Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described.

Meanings of technical and scientific terms used herein are to be commonly understood as by one of ordinary skill in the art to which the invention belongs, unless otherwise defined.

While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method comprising:
designing, with a processor, a mask for the fabrication of a metrology target, wherein the mask includes a first segmented feature adjacent to a second segmented feature, wherein the first segmented feature includes segments having a pitch and a first critical dimension, wherein the second segmented feature includes segments having the pitch and a second critical dimension different than the first critical dimension, wherein the first critical dimension is selected such that the first segmented feature is developed as a segmented printed feature of the metrology target, wherein the second critical dimension is selected such that the second segmented feature is developed as a continuous feature of the metrology target.

2. The method of claim 1, further comprising:
selecting the second critical dimension to be less than half the first critical dimension.

3. The method of claim 1, further comprising:
determining the second critical dimension experimentally according to a production tool performance with respect to exposure and development parameters.

4. The method of claim 1, further comprising:
configuring the metrology target as an imaging target.

5. The method of claim 1, further comprising:
configuring the metrology target as a scatterometry target.

6. The method of claim 1, further comprising:
designing the first segmented feature and the second segmented feature of the mask to be segmented along a short side of the first segmented feature and along a short side of the second segmented feature.

7. The method of claim 1, further comprising:
designing the first segmented feature and the second segmented feature of the mask to be segmented along a long side of the first segmented feature and along a long side of the second segmented feature.

8. The method of claim 1, wherein the continuous printed feature comprises:
at least one of a gap or a bar.

9. A method comprising:
designing, with a processor, a mask for the fabrication of a metrology target, a first segmented feature adjacent to a second segmented feature, wherein the first segmented feature includes segments having a pitch and a first critical dimension, wherein the second segmented feature includes segments having the pitch and a second critical dimension different than the first critical dimension;
exposing a resist layer with an image of the mask; and
developing the resist layer, wherein printed features associated with the first segmented feature develop as a segmented printed feature, wherein printed features associated with the second segmented feature develop as a continuous printed feature.

10. A method comprising:
designing, in a resist layer of a metrology target, at least one continuous feature, which is adjacent to at least one segmented feature having a pitch and a critical dimension, to have a same pitch and a same critical dimension with respect to the at least one segmented feature;
exposing the resist layer; and applying a cutting mask to the resist layer to remove a designed segmentation of the at least one continuous feature.

11. A target design file, designed according to the method of claim 1.

12. A metrology target produced according to the target design file of claim 11.

13. Production equipment, configured to produce the metrology target of claim 12.

14. An exposed resist layer, comprising:
a continuous printed feature, which is adjacent to a segmented printed feature having a pitch and a first critical dimension, wherein the segmented printed feature corresponds to a first segmented feature of a pattern mask, wherein the continuous printed feature corresponds to a second segmented feature of the pattern mask, wherein the first segmented feature includes segments having the pitch and the first critical dimension, wherein the second segmented feature includes segments having the pitch and a second critical dimension different than the first critical dimension.

15. The exposed resist layer of claim 14, wherein the second critical dimension is less than half of the first critical dimension.

16. The exposed resist layer of claim 14, wherein the second critical dimension is determined experimentally according to a production tool performance with respect to exposure and development parameters.

17. The exposed resist layer of claim 14, wherein the exposed resist layer is configured to produce a respective layer of an imaging target.

18. The exposed resist layer of claim 14, wherein the exposed resist layer is configured to produce a respective layer of a scatterometry target.

19. The exposed resist layer of claim 14, wherein the first segmented feature and the second segmented feature are segmented along a short side of the first segmented feature and along a short side of the second segmented feature.

20. The exposed resist layer of claim 14, wherein the first segmented feature and the second segmented feature are segmented along a long side of the first segmented feature and along a long side of the second segmented feature.

21. The exposed resist layer of claim 14, wherein the at least one continuous feature comprises:
at least one of a gap or a bar.

22. A metrology target produced using the exposed resist layer of claim 14.

23. Production equipment, configured to produce the metrology target of claim 22.

24. A mask designed to yield the exposed resist layer of claim 14.

25. A mask, comprising:
a first segmented feature adjacent to a second segmented feature, wherein the first segmented feature includes segments having a pitch and a first critical dimension, wherein the second segmented feature includes segments having the pitch and a second critical dimension different than the first critical dimension, wherein the first critical dimension is selected such that the first segmented feature is developed as a segmented printed feature, wherein the second critical dimension is selected such that the second segmented feature is developed as a continuous feature.

26. The mask of claim 25, wherein the second critical dimension is less than half the first critical dimension.

27. The mask of claim 25, wherein the second critical dimension is determined experimentally according to a production tool performance with respect to exposure and development parameters.

28. The mask of claim 25, configured to produce a respective layer of an imaging target.

29. The mask of claim 25, configured to produce a respective layer of a scatterometry target.

30. The mask of claim 25, wherein the first segmented feature and the second segmented feature are segmented along a short side of the first segmented feature and along a short side of the second segmented feature.

31. The mask of claim 25, wherein the first segmented feature and the second segmented feature are segmented along a long side of the first segmented feature and along a long side of the second segmented feature.

32. The mask of claim 25, wherein the at least one continuous feature comprises:
at least one of a gap or a bar.

33. An exposed resist layer produced using the mask of claim 25.

34. A metrology target produced using the mask of claim 25.

35. Production equipment, configured to produce the metrology target of claim 34.

36. A lithography system comprising:
an illumination source;
one or more projection optical elements; and
a mask, wherein the one or more projection optical elements are configured to expose a sample with an image of the pattern mask based on illumination from the illumination source, wherein the mask includes a first segmented feature adjacent to a second segmented feature, wherein the first segmented feature includes segments having a pitch and a first critical dimension, wherein the second segmented feature includes segments having the pitch and a second critical dimension different than the first critical dimension, wherein the first critical dimension is selected such that the first segmented feature is developed as a segmented printed feature, wherein the second critical dimension is selected such that the second segmented feature is developed as a continuous feature.

* * * * *